US006549424B1

(12) United States Patent
Beseth et al.

(10) Patent No.: US 6,549,424 B1
(45) Date of Patent: Apr. 15, 2003

(54) ELECTRONIC EQUIPMENT MODULE MOUNTING APPARATUS AND METHOD

(75) Inventors: Jeffrey L. Beseth, Raymore, MO (US); Daniel J. Cool, Overland Park, KS (US); Paul J. Rollheiser, Kansas City, KS (US); Sheldon T. Wheaton, Olathe, KS (US); Brian F. Ruff, Lee's Summit, MO (US); Jared S. Klein, Overland Park, KS (US)

(73) Assignee: Garmin Ltd. (KY)

( * ) Notice: Subject to any disclaimer, the term of this patent is extended or adjusted under 35 U.S.C. 154(b) by 0 days.

(21) Appl. No.: 10/086,482

(22) Filed: Feb. 28, 2002

(51) Int. Cl.[7] .................. H05K 7/12; H01R 13/428
(52) U.S. Cl. ............... 361/801; 361/747; 361/732; 361/726; 361/759; 439/157
(58) Field of Search .................. 361/747, 759, 361/732, 801, 802, 740, 726; 439/157

(56) References Cited

U.S. PATENT DOCUMENTS

| | | | | |
|---|---|---|---|---|
| 4,821,145 A | * | 4/1989 | Corfits et al. ............... 361/383 |
| 4,996,631 A | * | 2/1991 | Freehauf ..................... 361/415 |
| 5,321,962 A | * | 6/1994 | Ferchau et al. ............... 70/208 |
| 5,530,302 A | * | 6/1996 | Hamre et al. ................ 307/147 |
| 5,946,196 A | * | 8/1999 | Baek .......................... 361/798 |
| 6,067,225 A | * | 5/2000 | Reznikov et al. ........... 361/685 |
| 6,356,441 B1 | * | 3/2002 | Claprod ...................... 361/685 |
| 6,373,713 B1 | * | 4/2002 | Jensen et al. ................ 361/759 |

* cited by examiner

Primary Examiner—David Martin
Assistant Examiner—Dameon E. Levi
(74) Attorney, Agent, or Firm—Devon A. Rolf (57) ABSTRACT

An equipment module, a module retention device, as well as a system and a method for mounting equipment modules are disclosed. The modules can be installed without tools, using the retention device. Each module includes a chassis unit which slides into a unit rack, which is in turn attached to a mounting frame. The entire assembly may be mounted to an instrument panel. The module retention device is attached to the chassis unit, typically engaging a slot on the rack. A rotating fastener secures the retention device in the engaged position. The method includes inserting an electronic module into the open end of a unit rack, sliding an engagement lug attached to a cam lever into engagement with a slot on the rack, electrically coupling a connector on the module with a connector on the rack, and attaching the rack to the mounting frame.

11 Claims, 12 Drawing Sheets

ELECTRONIC EQUIPMENT MODULE MOUNTING APPARATUS AND METHOD

FIELD OF THE INVENTION

The invention relates generally to mounting devices and methods of mounting electronic equipment. More particularly, the invention relates to mounting devices and methods of mounting avionic equipment in an aircraft.

BACKGROUND OF THE INVENTION

Electronic equipment and devices in general can be incorporated into increasingly smaller packages. In the aviation industry, instrumentation and other electronic equipment operates in an increasingly integrated and autonomous fashion. Such equipment, termed "avionics", or the electronic instrumentation devices used in an aviation setting, including electronic sensors, communications equipment, navigation equipment, and displays, is therefore also subject to trends in miniaturization and integration, as used in aircraft of all sizes.

Pricing of electronic equipment for aircraft is competitive, and not all aircraft require the same combination of instrumentation options. To lower costs and increase the number of end user options, more flexibility in avionic equipment is needed. In response to the need for flexibility, avionics have moved toward modular installations. For example, a communication system, a transponder, and a navigation system can each be manufactured as separate modules, which are individually selected for an aircraft based on cost and the needs of the particular application. Modular designs are individually replaceable, which facilitates aftermarket upgrades, and inexpensive replacement/repair operations.

Because of the limited space available on any given aircraft, designers and manufacturers tend to locate avionics modules in areas of the aircraft where space is at less of a premium. Areas commonly used for avionics installation include the rear of the aircraft, or the nose compartment. Because the pilot or other operator is typically located remotely from the modules, controls and data displays for the modules mounted to the aircraft instrument panel must typically be linked to the operator through various communications media, such as wires, fiber optics, and the like.

Space constraints are eased by locating electronic modules in remote areas of the aircraft. However, such locations make installation, repair, and replacement more difficult, and more expensive. Additionally, when avionics modules are located remotely from the aircraft instrument panel, longer communication lines are needed to exchange data and commands with the operator in the cockpit. Longer communication lines increase the difficulty of installation, as well as the risk of communication line failure due to vibration, physical movement, and other factors.

In some aircraft, the avionics modules are mounted directly to the instrument panel, with displays and controls located on the front of the module, similar to the way stereo equipment is installed in an automobile. Such configurations reduce problems due to long communication lines, however, other limitations arise.

When avionics modules are mounted directly to the instrument panel, space considerations become more significant due to the presence of aircraft controls directly behind the panel, such as yoke controls and ventilation ducts, for example. Displays and controls for the modules must also be located in a relatively limited space below the top of the instrument panel, so as not to impair the pilot's vision. Additionally, other items mounted to the instrument panel must be avoided when mounting displays and controls. Thus, fitting a group of modules, displays, and controls within a given area on the instrument panel requires a flexibility in mounting configurations that is lacking in current designs.

Another difficulty is encountered when electronic equipment contained within avionics modules requires repair/replacement. Each avionics module is typically of a different size and shape, and involves a different mounting apparatus. The technician is never sure of what he will find until viewing the aircraft in person, and even then; it is almost guaranteed that removing modules will be a time-consuming, labor-intensive process. Usually, several fasteners must be removed, cables re-routed, and other modules may also need removal to access desired portions of the particular module in need of repair.

Therefore, there is a need in the art for apparatus, modules, methods, and systems which lend themselves to facilitating repair and replacement of electric equipment modules, such as the avionics modules used in aircraft. A mounting approach for these modules which requires no special tools would be especially valuable. Such an approach should also provide enhanced mounting system consistency, and flexibility with respect to locating displays and controls associated with various modules.

SUMMARY OF THE INVENTION

The above mentioned problems with the installation, repair, and/or replacement of avionics, along with the need for mounting flexibility are addressed by the present invention, and will be understood by reading and studying the following specification. Systems, devices, and methods are provided for various avionic equipment mounting configurations and apparatus. The systems, devices, and methods of the present invention offer more convenient and more flexible mounting configurations to support increasingly efficient and integrated installation, repair, and replacement of avionics equipment, included associated displays and controls.

In one embodiment, an electronic equipment module is provided which can be installed and removed without using tools. The module includes a chassis unit which slides into a unit rack, which in turn is attached to a mounting frame. The entire assembly is typically mounted to a surface, such as the instrument panel of an aircraft. The module is placed into electrical communication with the unit rack via mating connectors attached to the module and to the unit rack using a pivoting cam lever and engagement lug. The lever/lug combination, which is attached to the chassis unit, is capable of slidable engagement with a slot located on the interior surface of the unit rack, and when fully engaged with the slot, ensures the existence of a mating electrical connection between the aforementioned connectors. The lever can be located so that substantially equal force is applied across all of the mating connections within the corresponding connectors. A rotating fastener attached to the cam lever and capable of rotatable engagement with the chassis unit secures the cam lever in the engaged position.

Thus, another embodiment of the invention includes a module retention device, such as the cam lever attached to a pivot and a rotating fastener. The pivot, which is attached to the chassis unit, can be fixedly attached to the cam lever, or rotatably engaged with the cam lever. An engagement lug, attached to the cam lever, is adapted for slidable engagement with a slot included in a unit rack. The slot engaged by the lug includes two open-ended sub-slots, typically formed so as to intersect at an obtuse angle.

In another embodiment, the invention includes an electronic equipment module mounting system, which comprises a mounting frame, a plurality of electronic equipment modules (each including chassis units, cam levers, lugs, and pivots), and a unit rack coupled to each of the electronic modules and the mounting frame. The modules can include any type of avionic or electronic equipment, such as engine and/or airframe monitoring circuitry, a computer, etc. The mounting system can also include a display unit, perhaps mounted to an instrument panel, located directly in front of the electronic equipment modules. The mounting system also includes an embodiment where a motherboard is coupled between one or more of the electronic equipment modules and the display unit.

Finally, the invention includes a method of mounting electronic equipment modules in a mounting frame. The method includes inserting an electronic module into the open end of a unit rack, sliding the lug attached to a chassis unit of the module into slidable engagement with a slot located on the interior surface of the unit rack, electrically coupling a connector on the module with a corresponding connector on the unit rack, and attaching the unit rack to the mounting frame. The method also includes establishing electrical communication between a display unit and the electronic equipment module, and mounting the display unit on the mounting frame or to an instrument panel. Of course, the cam lever can be fully engaged and secured (using a rotatable fastener) without the use of tools.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are also realized and attained by means of the instrumentalities, procedures, and combinations particularly pointed out in the appended claims.

DETAILED DESCRIPTION OF EMBODIMENTS OF THE INVENTION

In the following detailed description of the invention, reference is made to the accompanying drawings which form a part hereof, and in which is shown, by way of illustration, specific embodiments in which the invention can be practiced. In the drawings, like numerals describe substantially similar components throughout the several views. These embodiments are described in sufficient detail to enable those skilled in the art to practice the invention. Other embodiments can be utilized and structural, logical, and electrical changes can be made without departing from the scope of the present invention.

References to directions, such as up, down, above, or below, etc. will have their normal meaning with the ground being downward when referring to embodiments not used in aircraft. When referring to embodiments mounted to an aircraft; downwards will refer to the direction towards the floor of the aircraft (i.e., to which the landing gear is typically mounted), regardless of the orientation of the aircraft during flight. When referring to embodiments of the invention that are mounted adjacent to a mounting surface, such as an airplane instrument panel, references to the "front" of the panel will refer to a side of the panel that is intended for operator accessibility, while references to the "rear" of the panel will refer to the side of the panel that is normally towards the nose of the aircraft, and not easily accessible to an aircraft operator.

In one embodiment, the system and method of the invention for mounting electronic equipment modules is used in an aircraft, and is attached to a mounting surface within the aircraft, such as the instrument panel. Although this setting is used as an example, the mounting system and method described can be used in other settings as well without departing from the scope of the invention.

Figure 1A:
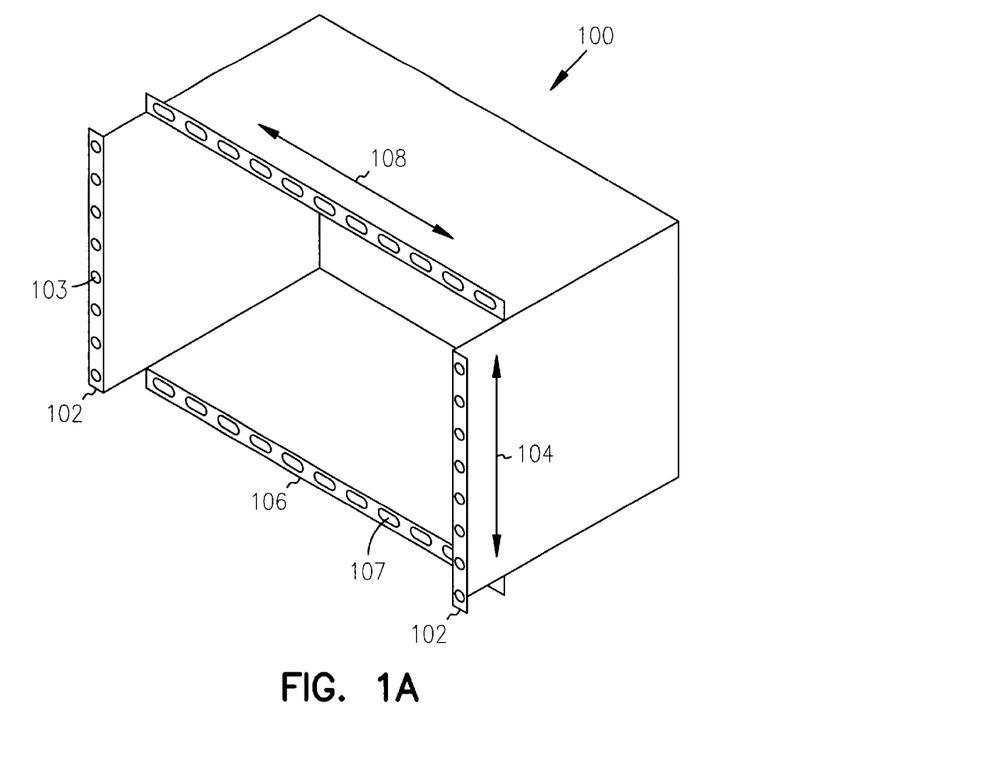
FIG. 1A is a perspective view of a mounting frame according to an embodiment of the invention.

FIG. 1A is a perspective view of a mounting frame according to an embodiment of the invention. The mounting frame 100 includes a pair of first mounting surfaces 102, each with a plurality of mounting holes 103 which permit a range of assembly along the direction 104. The mounting frame 100 also includes a pair of second mounting surfaces 106, each with a plurality of mounting slots 107, that enable a range of assembly along the direction 108. In the illustrated embodiment, pairs of mounting surfaces 102, 106 are shown on opposing sides of the mounting frame 100. However, it should be understood that other configurations of mounting surfaces 102, 106 are contemplated, such as using only a single mounting surface instead of a pair of surfaces, using more than two mounting surfaces (e.g., using three cooperating mounting surfaces), or using mounting surfaces that are not on opposing sides of the frame 100. Likewise; the mounting holes 103 and slots 107 shown in FIG. 1A are merely examples of many possible configurations which can be used for attaching items to the frame 100, using the first and second mounting surfaces 102, 106.

One skilled in the art will recognize that other configurations for mounting will also be operative to secure various items to the frame 100. The first mounting holes 103 and the second mounting slots 107 can be exchanged on their respective mounting surfaces 102 and 106. Similarly, both sets of surfaces 102, 106 can use holes 103, or both sets of surfaces 102, 106 can use slots for attaching items thereto. In one possible configuration of the invention, therefore, the first mounting holes 103 and the second mounting slots 107 can be adapted for use with a fastener such as a screw. However, other fasteners known to those skilled in the art, both temporary and permanent, such as rivets, adhesives, bolts and nuts, etc. can also be used without departing from the scope of the invention.

Figure 1B:
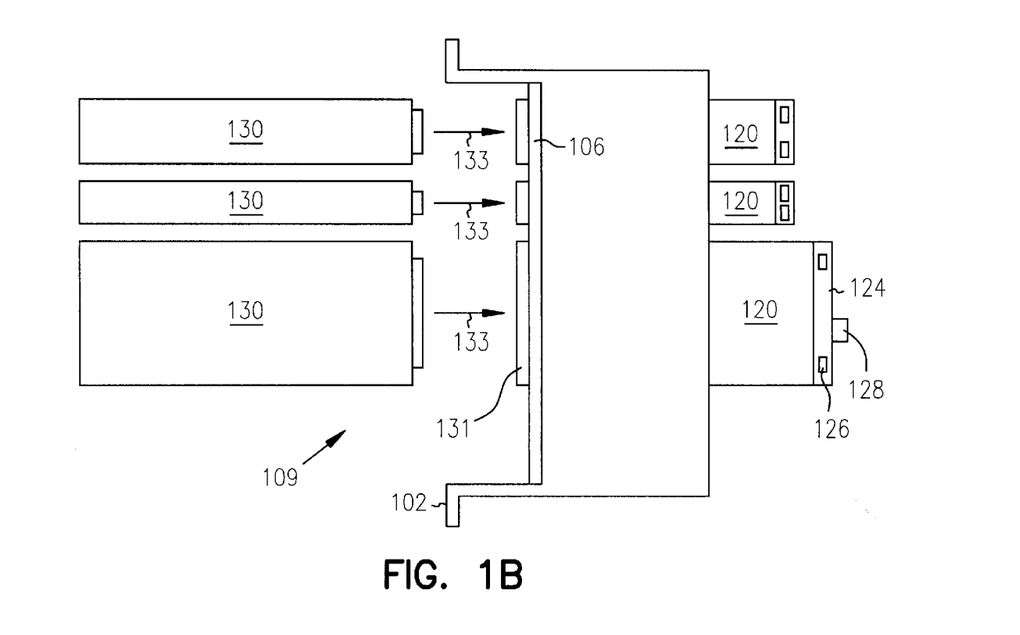
FIG. 1B is a top view of a mounting system according to an embodiment of the invention.

FIG. 1B is a top view of a mounting system 109 according to an embodiment of the invention. A number of unit racks 120 are shown. Each unit rack 120 includes a back plate 124 secured to the unit rack 120 by one or more fasteners 126. In one embodiment, the back plate 124 further includes an electrical connector 128, such as a backplane pin connector. Each unit rack 120 can be attached to the second mounting surface 106 of the mounting frame 100. Electronic equipment modules 130 are shown as insertable into the open ends 131 of, or slidably engagable with corresponding unit racks 120 along the direction of the arrows 133. Such modules 130 can include, but are not limited to including, various devices, such as a cellular telephone, an aircraft radio, a transponder, a global positioning system (GPS) receiver, a computer, engine monitoring circuitry, airframe monitoring circuitry, atmospheric monitoring circuitry, and/or other devices and equipment, such as a data acquisition system, which process information from sensors, acquire such information, and communicate the information in various forms.

In one embodiment, each unit rack 120 is specifically sized to accept a corresponding electronic equipment module 130. Prior art configurations do not provide the mounting flexibility of a guided slot, such as that provided by the combination of a unit frame 120 and a backplate 124, along with the ability to tailor the size of the slot to accommodate specific electronic equipment modules 130. Rather, prior art configurations are limited to uniform module sizes.

Figure 1C:
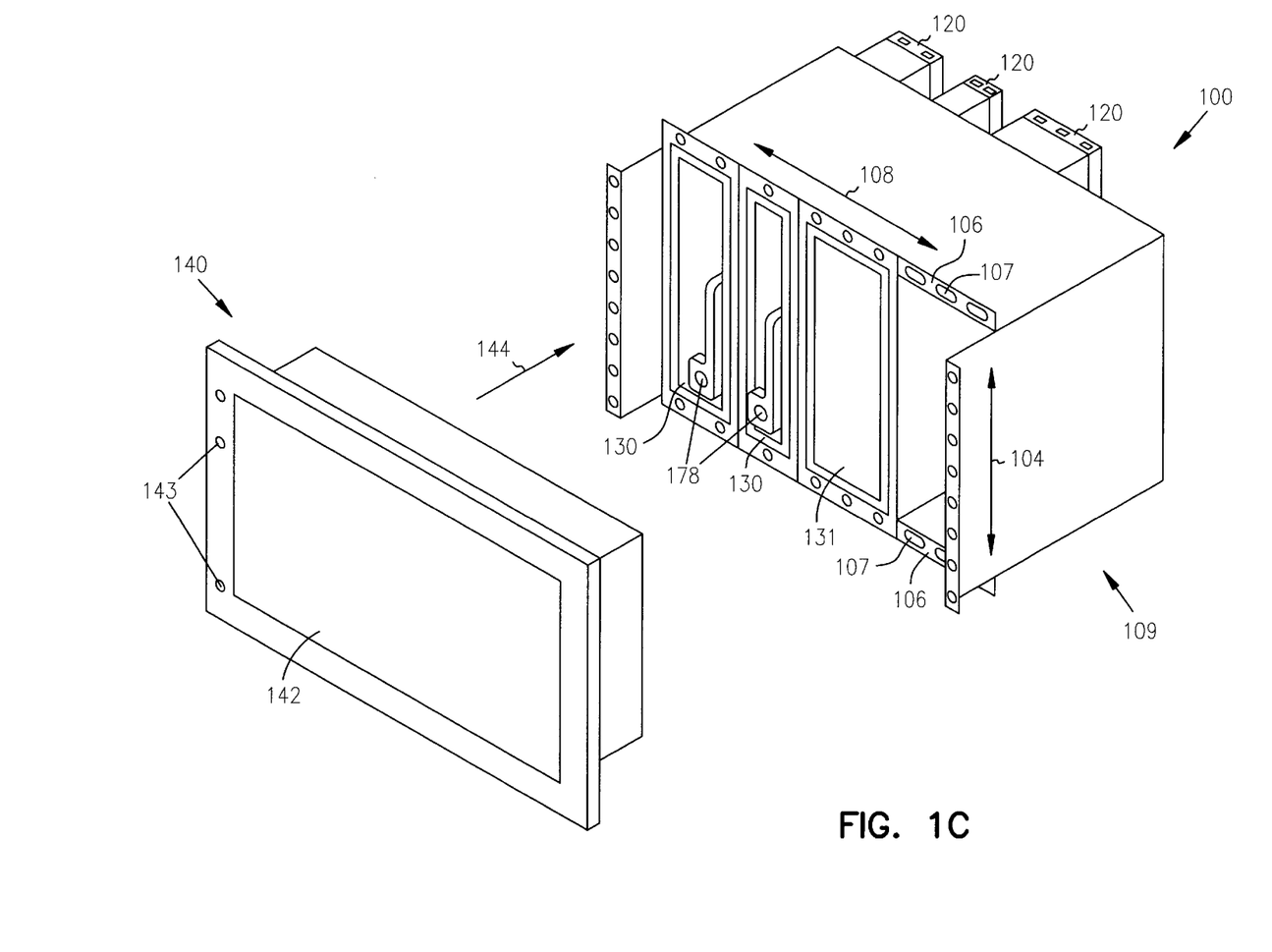
FIG. 1C is a perspective view of a mounting system according to an embodiment of the invention.

FIG. 1C is a perspective view of a mounting system 109 according to an embodiment of the invention, wherein the modules 130 are slidably engaged with, and attached to, the unit racks 120, which are in turn secured to the second mounting surfaces 106 via slots 107. As discussed above, other means of attaching the unit racks 120 to the mounting frame 100 are also contemplated.

A display unit 140, including a flat panel, color liquid crystal display (LCD) screen 142, or alternate display units capable of conveying data to the operator using visual devices can be attached to the frame 100, or to an instrument panel, as will be discussed below. In one embodiment, the display unit 140 includes a number of controls 143 such as knobs, switches, levers, dials, and the like. The display unit 140 is shown mounted separately from the modules 130, generally following a path along the arrow 144. Mounting the display unit 140 separately accomplishes two objectives: providing additional display mounting locations, and adding flexibility with regard to the information displayed thereon. Given the construction of the frame 100, any of a number of three dimensional ranges of mounting locations are possible. Having a separately mounted display unit 140 also provides greater flexibility in the location of controls 144. Finally, providing a single display unit 140 for a number of electronic modules 130 allows information from several modules 130 to be displayed in an organized, integrated manner on the display unit 140.

As shown in FIGS. 1A and 1C, the unit racks 120 can be mounted along a range of mounting locations 108. The slots 107 of the second mounting surfaces 106 allow the unit racks 120 to be positioned to one side or the other of the mounting frame 100. This configuration allows further flexibility in locating modules 130, as well as the entire system 109, on a surface, such as a crowded cockpit instrument panel. Unit rack 120 usage permits a variety of sizes and shapes of electronic modules 130 to be mounted in various locations, while maintaining ease of replacement, since the unit racks 120 guide removal and replacement of the modules 130. As will be discussed below, the unit racks 120 can also be configured with mechanical mechanisms 178 for quickly securing and releasing the modules 130 from the unit racks 120, as well as for making/breaking electrical connections as the modules 130 are inserted and removed, respectively, from the unit racks 120.

Figure 2:
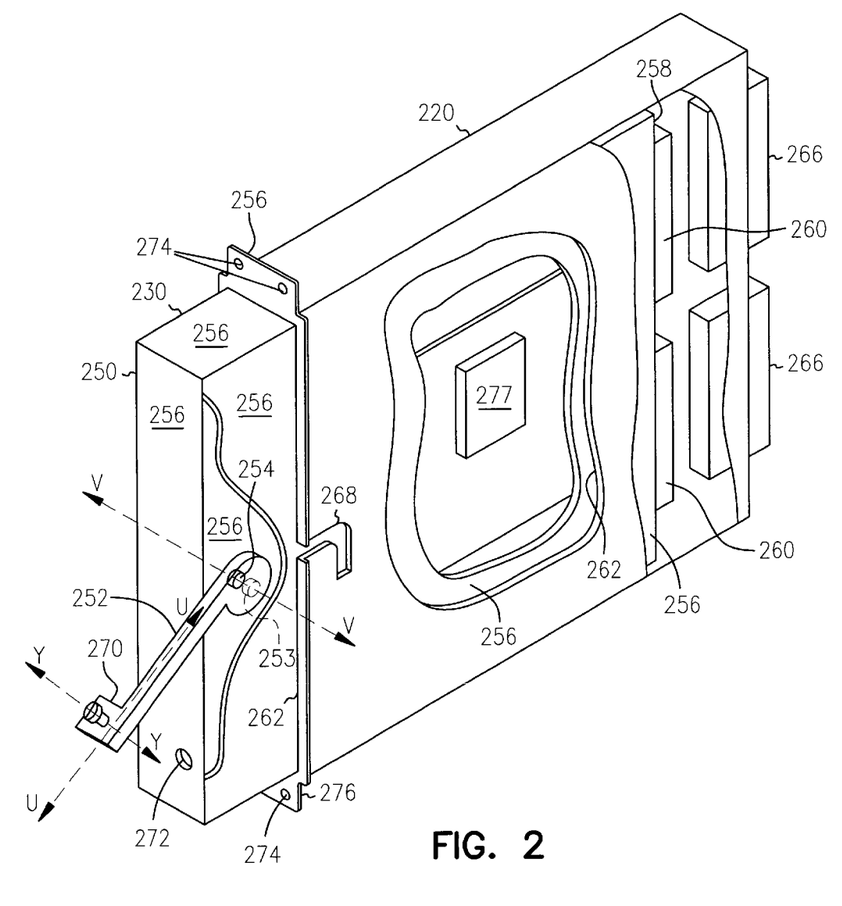
FIG. 2 is a perspective view of an electronic equipment module partially engaged with a unit rack according to an embodiment of the invention.

FIG. 2 is a perspective view of an electronic equipment module partially engaged with a unit rack according to an embodiment of the invention. The electronic equipment module 230 includes a chassis unit 250 and a cam lever 252 attached to the chassis unit 250 with a pivot 253. An engagement lug 254 is also attached to the cam lever 252. The pivot 253, which is centered on the axis of rotation "V", is typically mounted to the exterior surface 256 of the chassis unit 250. The engagement lug 254 can be located so as to be substantially coaxial with the axis of cam lever 252 rotation "V", or offset from the axis "V" (and the pivot 253), as shown. The exterior surface 256 of the chassis unit 250 can be smooth, or variegated, as shown.

The chassis unit 250 also has a rear face 258 to support the mounting of one or more electric connectors 260, if desired. The exterior surface 256 of the chassis unit 250 is capable of slidable engagement with the interior surface 262 of a unit rack 220, which can include one or more electric connectors 266 mounted to the interior surface 262.

The engagement lug 254, attached to the cam lever 252, is capable of slidable engagement with a slot 268 located on the interior surface 262 of the unit rack 220. The connectors 260 are capable of electrically coupling to the corresponding connectors 266 when the cam lever 252 is in an engaged position. When the cam lever 252 is in a non-engaged position (as shown in FIG. 2), the location or range of locations which define the non-engaged position being determined by the design and orientation of the cam lever 252 with respect to the slot 268, the connectors 260 are not electrically coupled with the connectors 266.

The module 230 can also include a rotating fastener 270 attached to the cam lever 252. The fastener 270 is capable of rotatable engagement with the chassis unit 250 (typically via a threaded orifice 272) so as to secure the cam lever 252 in an engaged position. The fastener 270 can be any number of types, rotational or non-rotational, similar to or identical to a screw, a spring-loaded snap, a cam-locking mechanism, a quarter-turn locking fastener, or a Dzus fastener, such as the PVS35 stud assembly sold by DFS International, Inc.

Once the module 230 is secured within the unit rack 220, the rack 220 (similar to or identical to the rack 120) can be mounted to the frame 100 (shown in FIG. 1) using screws or other fasteners inserted into the holes or slots 274 included in the mounting flanges 276 of the unit rack 220. Alternatively, the unit rack 220 can be first mounted to the frame 100, and then the module 230 can be secured within the unit rack 220. As noted above, a module 230 can include any type of electronic circuitry 277, such as, for example, a cellular telephone, an aircraft radio, a transponder, a global positioning system (GPS) receiver, a computer, engine monitoring circuitry, airframe monitoring circuitry, atmospheric monitoring circuitry, and/or other devices and equipment, such as a data acquisition system, which process information from sensors, acquire such information, and communicate the information in various forms.

Figure 3A:
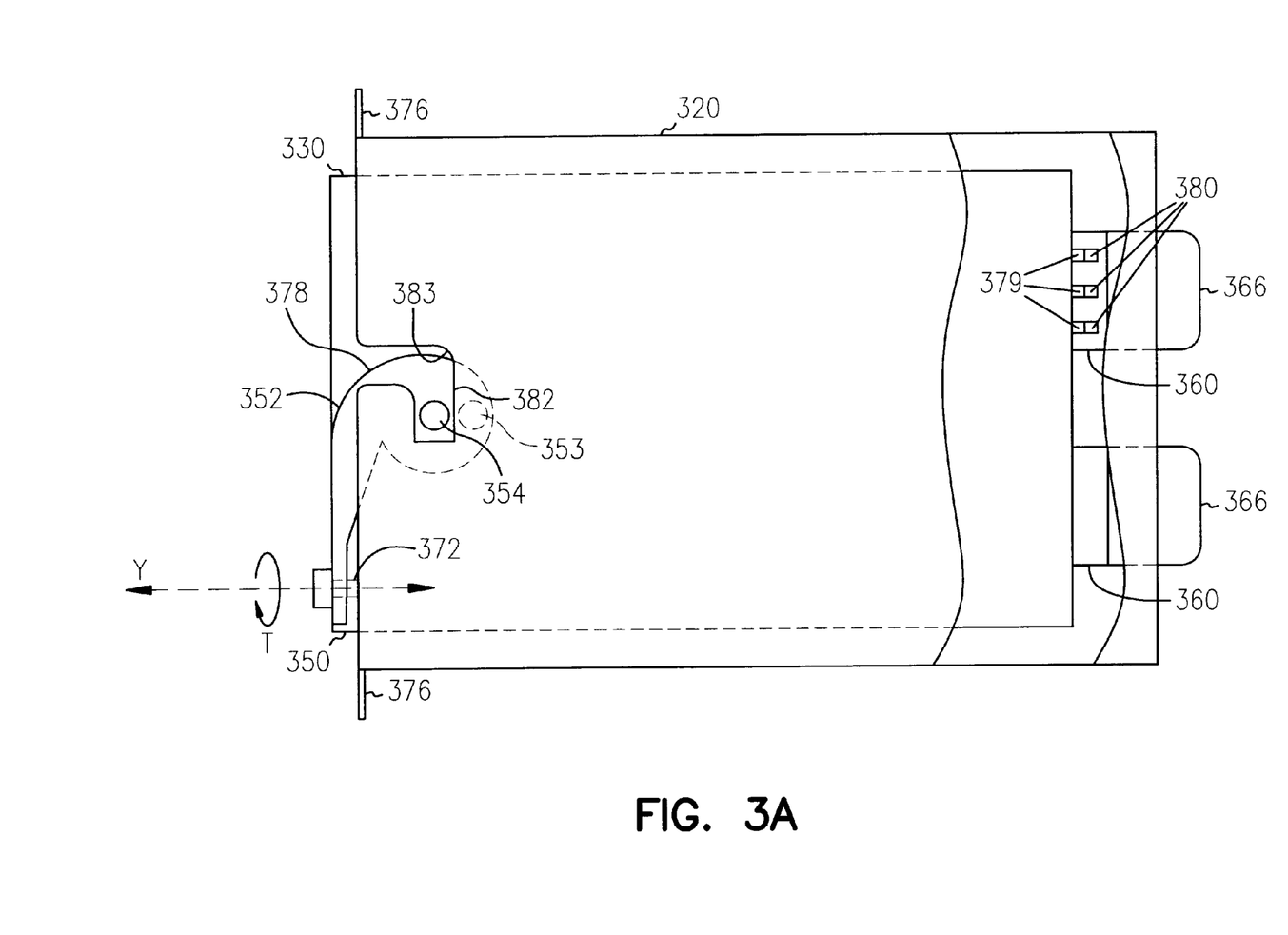
FIGS. 3A, 3B, and 3C are side plan views of an electronic equipment module fully, partially, and non-engaged with a unit rack, respectively, according to an embodiment of the invention.
Figure 3B:
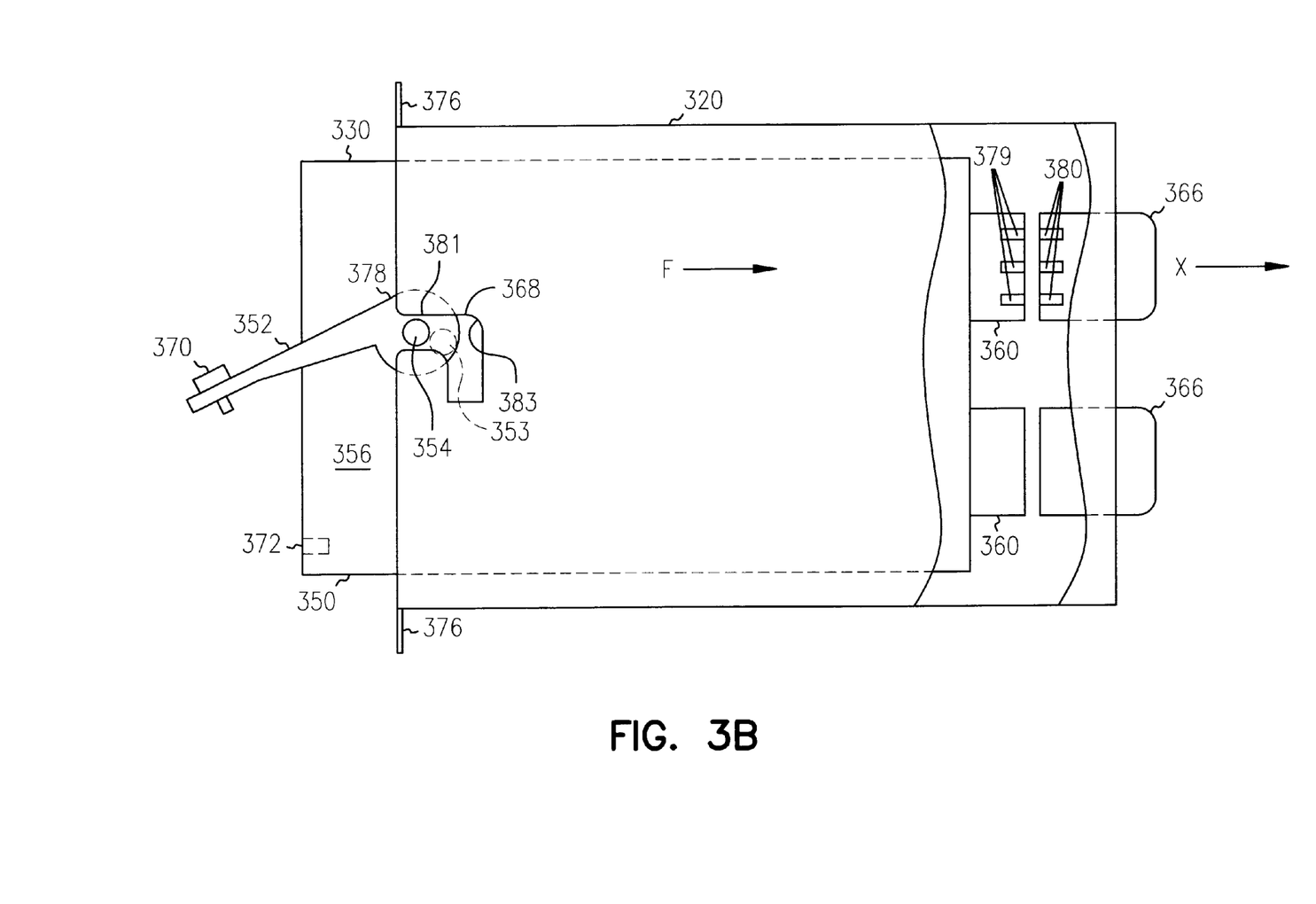
Figure 3C:
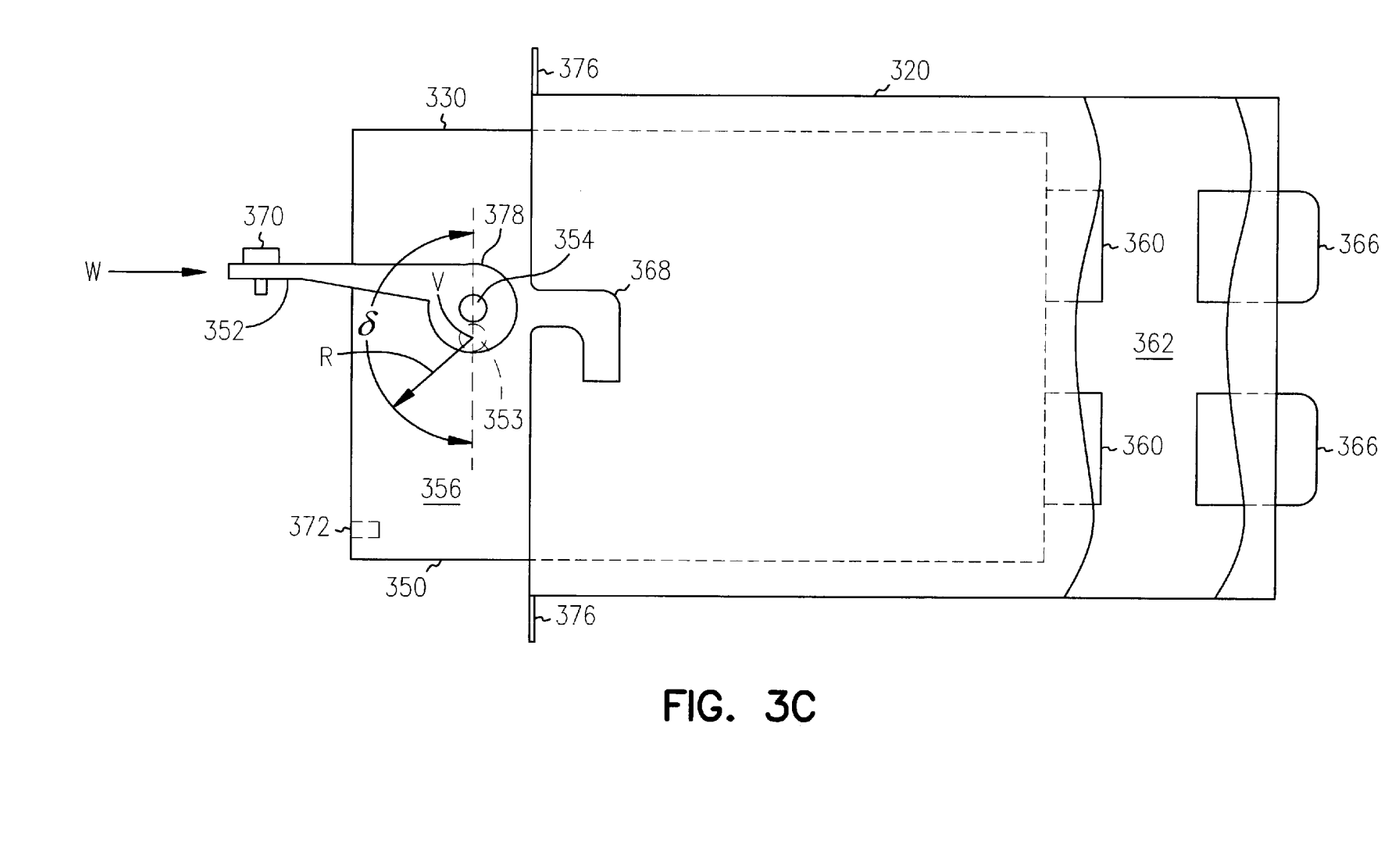

FIGS. 3A, 3B, and 3C are side plan views of an electronic equipment module 330 fully, partially, and non-engaged with a unit rack 320, respectively, according to an embodiment of the invention. These figures serve to clarify the operational relationship, and engagement, between the cam lever 352, the engagement lug 354, and the slot 368. As used herein, when the cam lever 352 is described as being in a "non-engaged" position, this means that the lever 352 is located substantially parallel to a line "W" which coincides with the direction of slidable engagement between the module 330 and the unit rack 320. When the cam lever 352 is described as being in an "engaged" position, this means that the lever 352 is located with its longitudinal axis (shown as "U" in FIG. 2) substantially perpendicular to the line W which coincides with the direction of slidable engagement between the module 330 and the unit rack 320.

Thus, referring back to FIG. 1, FIG. 2, and to FIGS. 3A–3C, it can be seen that the invention can be embodied in the form of a module retention device 378 including a cam lever 352 extending along a longitudinal axis "U", attached to an engagement lug 354. The cam lever 352 is also attached to a pivot 353 extending along a horizontal axis of rotation "V", along with a rotating fastener 270 attached to the cam lever 352. The rotating fastener is capable of rotation about a rotational axis "T". It should be noted.that the longitudinal, horizontal, and rotational axes are substantially non-parallel.

The retention device 378 can include a fastener 370 of any type, rotating or non-rotating, including any of those described with respect to the fastener 270 (shown in FIG. 2), such as a quarter-turn locking fastener. The fastener 370 is used to secure the cam lever 352 to the chassis unit 350, typically by engaging an orifice 372, constructed appropriately to receive the fastener 370 and secure the lever 352 against vibrational release.

The pivot 353 can be fixedly attached to the cam lever 352, such that the pivot 353 rotates freely with respect to the module 330 and chassis unit 350, following the movement of the cam lever 352 throughout an arc δ extending from about 20 degrees to about 180 degrees along a radius centered on the rotational axis "V" of the pivot 353. Alternatively, the pivot 353 can be rotatably engaged with the cam lever 352, such that the pivot 353 remains fixed in relation to the module 330 and chassis unit 350, and does not move so as to follow the cam lever 352 as it rotates about the pivot 353 through the arc 6. In either case, the pivot 353 is typically attached to the chassis unit 350 and the engagement lug 354 is adapted for slidable engagement with a slot 368 included in the unit rack 320, which is in turn placed in sliding engagement with the module 330, and the cam lever 352 is capable of rotating through an arc δ having a radius "R" which intersects the horizontal rotational axis "V" at the pivot 353. It should be noted, referring now specifically to FIG. 3B, that the connectors 360 include a plurality of contacts 379 (e.g., sockets or pins), and that the corresponding connectors 366 include a corresponding plurality of contacts 380 (e.g., pins or sockets). As the cam lever 352 is rotated about the pivot 353 axis "V", from the non-engaged position (shown in FIG. 3A) to the engaged position (shown in FIG. 3C), the result is the application of a substantially equal force "F" to each of the pluralities of contacts 379, 380. In fact, the cam lever 352 can be located on the surface 356 of the chassis unit 350, so that the substantially equal mating force "F" applied to the pluralities of contacts 379, 380 is concentrated along a line "W" substantially parallel to a mating direction "X" of pluralities of contacts 379, 380.

Figure 4A:
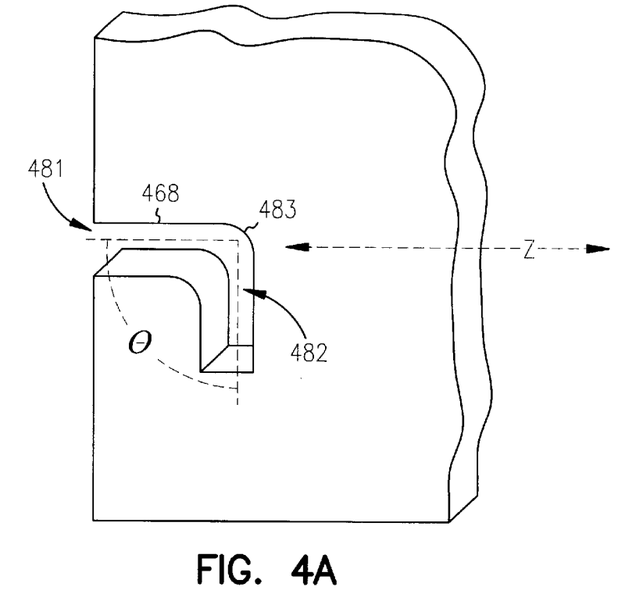
FIGS. 4A, 4B, and 4C are perspective detail views of a unit rack engagement slot and cam lever according to various embodiments of the present invention.
Figure 4B:
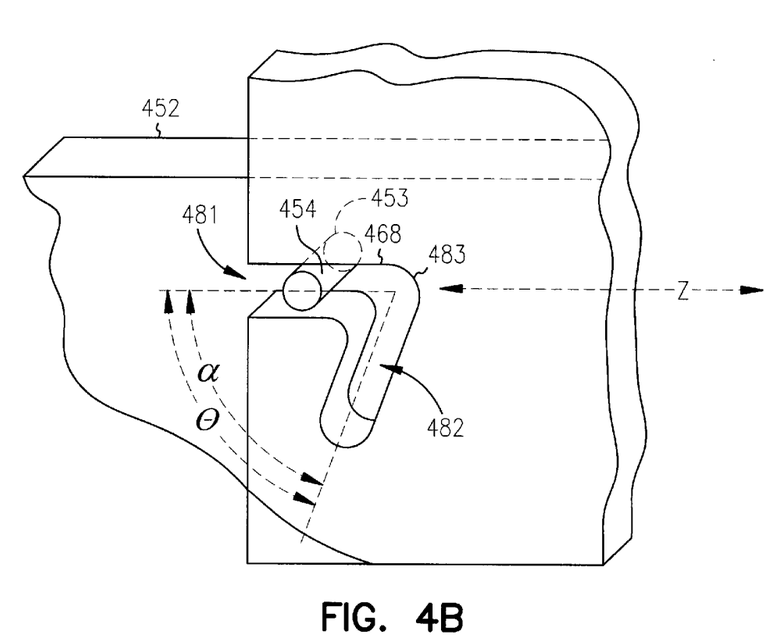
Figure 4C:
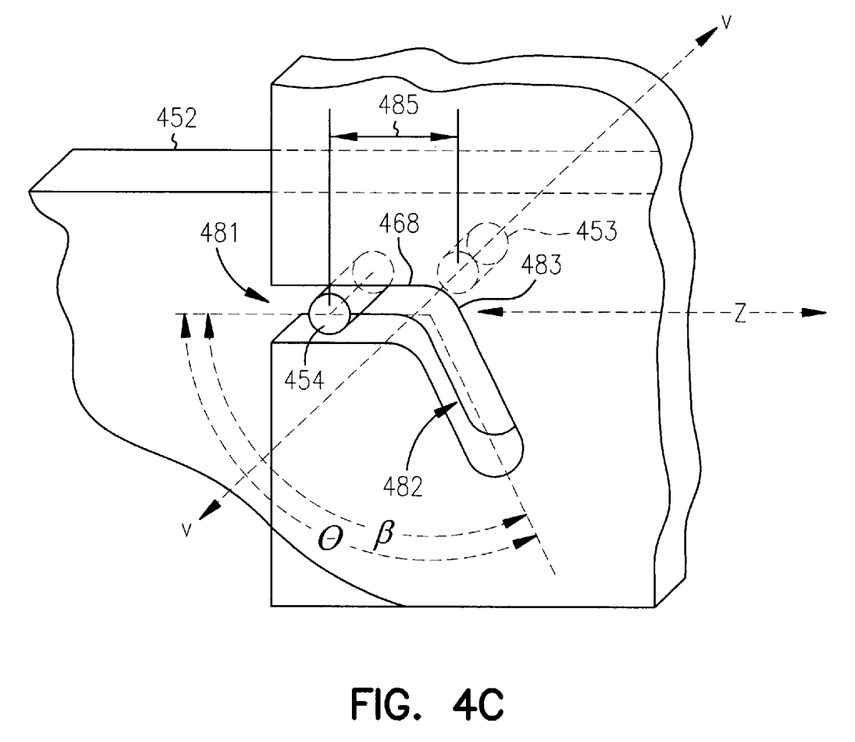

FIGS. 4A, 4B, and 4C offer perspective detail views of a unit rack engagement slot and cam lever according to various embodiments of the present invention. As can be seen in FIG. 4B, the slot 468 includes two open-ended sub-slots 481, 482 intersecting to form an angle θ, such as the acute angle a between the sub-slots 481, 482. Of course, the angle θ can be a right angle (i.e., angle θ=90, as shown in FIG. 4A), or the angle θ can be even greater than 90 degrees, as shown by the dashed arc β in FIG. 4C. As shown in FIG. 4B, the engagement lug 454 (located substantially coaxially with the pivot 453) moves about the pivot 453 axis of rotation "V" from the first sub-slot 481 into the second sub-slot 482, such that the module 330 will be most tightly retained at the intersection 483 of the sub-slots 481, 482, which can be a direct intersection, a curve or curved intersection (as shown in FIG. 4A), or any number of other shapes.

Thus, it should be noted that the configuration of the slot 468 can be described in a number of ways. For example, when the angle θ is approximately 90 degrees, the slot can be described as "substantially L-shaped." The slot 468 can also be more generally described to include two open-ended sub-slots 481, 482 intersecting to form a curve 483. The slot 468 can also be described as including a first open-ended sub-slot 481 located approximately parallel to a line "Z" extending from the front end of the unit rack to the rear end of the unit rack, such that the slot 468 also includes a second open-ended sub-slot 482 which is not located approximately parallel to a line extending from the front end of the unit rack to the rear end of the unit rack. Finally, the slot 468 can be more simply described as including two open-ended sub-slots 481, 482 intersecting to form an angle θ, such as an acute angle a, or an obtuse angle β, as described above.

Referring now to FIG. 4C, it should be noted that while the pivot 453 and engagement lug 454 have been shown as substantially coaxial in FIG. 4B, such is not necessarily the case. For example, it can be seen that the pivot 453, which is typically located or centered on the axis of rotation "V" for the cam lever 452, may be offset by a selected distance 485 from the center of the location of the engagement lug 454 (also shown in FIGS. 2 and 3A–3C). Using this method of construction, when the engagement lug 454 begins to travel into the second open-ended sub-slot 482 as it rotates about the pivot 453, then there is an "over-center" engagement action between the engagement lug 454 and the slot 468.

Figure 5A:
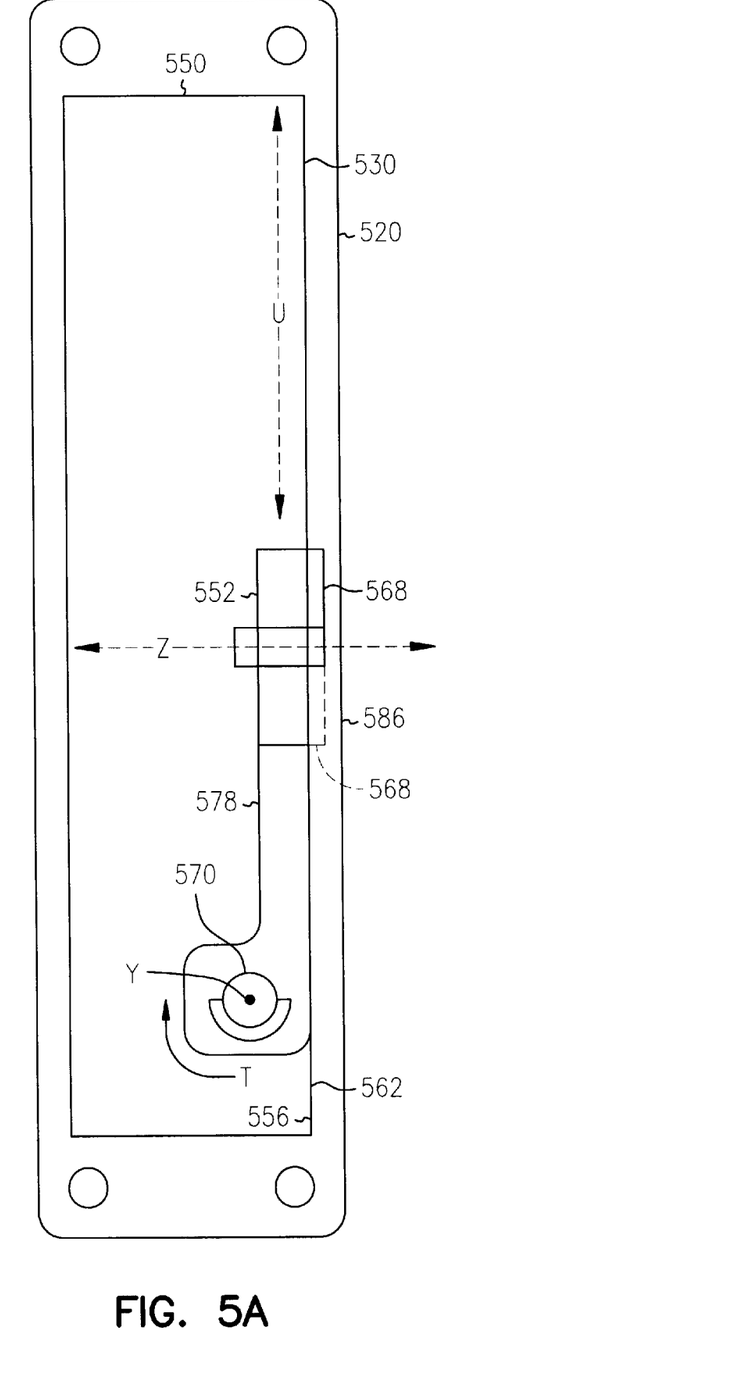
FIGS. 5A and 5B are front plan views of an electronic equipment module according to an embodiment of the present invention.
Figure 5B:
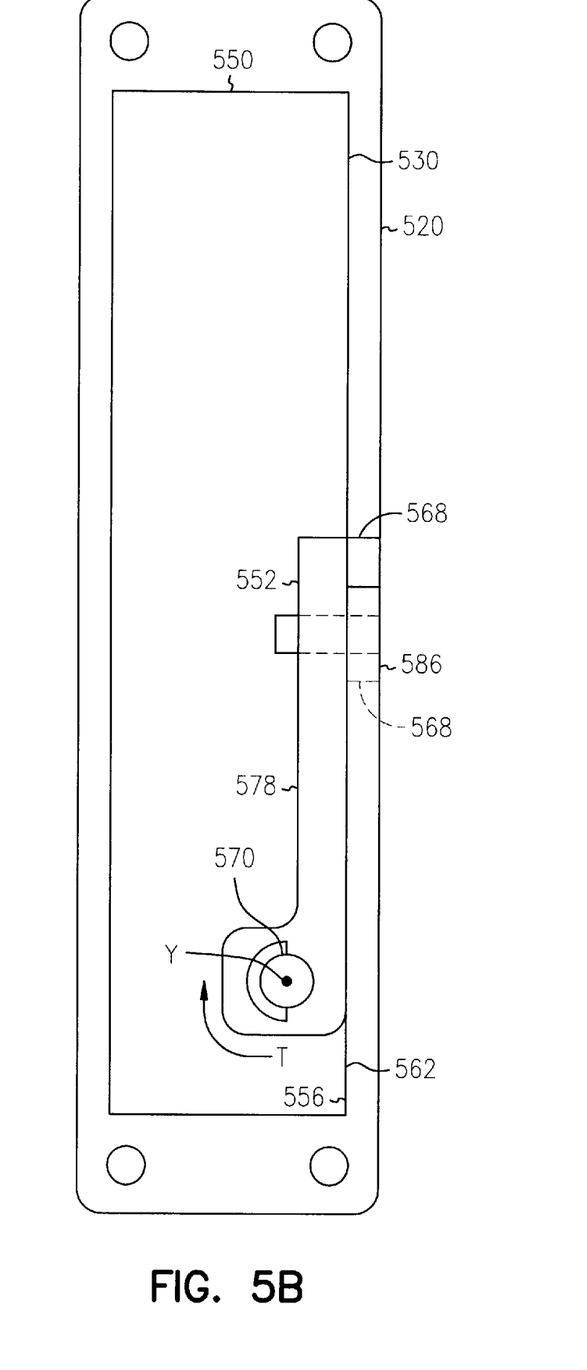

FIGS. 5A and 5B are front plan views of an electronic equipment module according to an embodiment of the present invention. In these views it is made clear that the retention device 578 can include a fastener 570 of any type, rotating or non-rotating, including any of those described with respect to the fastener 270 (shown in FIG. 2), such as a quarter-turn locking fastener. The fastener 570 is used to secure the cam lever 552 to the chassis unit 550. In FIG. 5A is shown a quarter-turn locking fastener 570 in the unlocked position, whereas in FIG. 5B is shown a quarter-turn locking fastener 570 in the locked position. When in the locked position, the cam lever 552 is prevented from vibrating from the engaged position into the non-engaged position. The lever 552 can be released, however, by moving the fastener 570 form the locked to the unlocked position.

Also apparent from FIGS. 5A–5B are the relative positions of the chassis unit 550 and the unit rack 520. And more specifically, the slidable engagement which occurs between the exterior surface 556 of the chassis unit 550, and the interior surface 562 of the rack unit 520. It can also be seen that the slot 568 can be formed entirely on the interior surface 562 of the rack unit 520 (as shown in FIG. 5A), or formed so as to include the interior surface 562 and the exterior surface 586 of the rack unit 520 (as shown in FIG. 5B, as well as in FIGS. 4A–4B).

Figure 6:
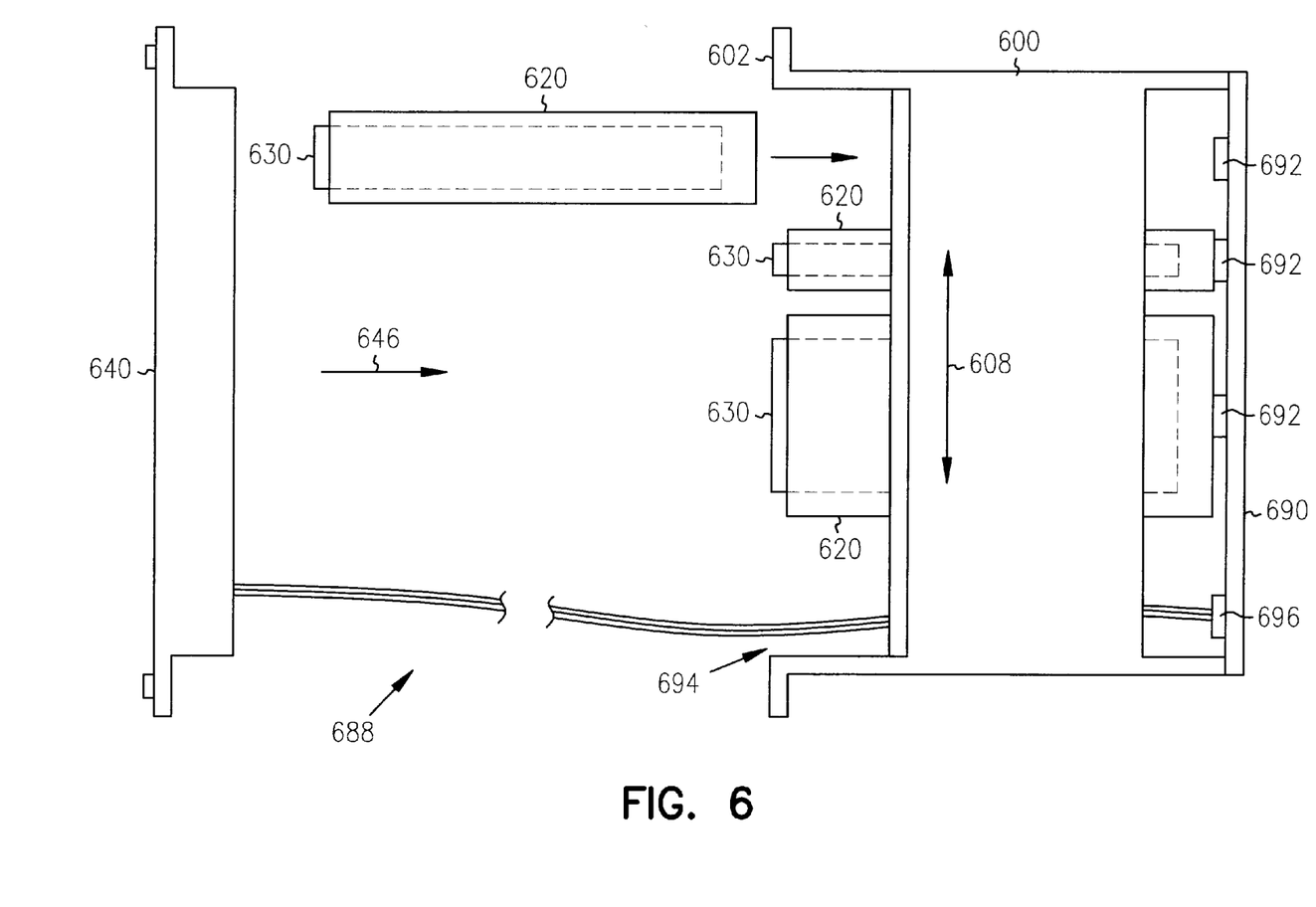
FIG. 6 is a top view of a mounting system according to an alternative embodiment of the invention.

FIG. 6 is a top view of a mounting system 688 according to an alternative embodiment of the invention. The mounting frame 600 is shown with a motherboard 690 attached to a back side. Electronic modules 630 are electrically coupled to the board connectors 692 that are in turn attached to the motherboard 690. Communication lines 694 run from a separate connector 696 on the motherboard 690 to a display unit 640.

The use of a motherboard 690 allows for greater ease of electrically connecting communication lines 694 from the modules 630 to the display unit 640. While a separate mounting frame for the display unit 640 is not needed in this configuration, the use of a motherboard dedicates board connectors 692, 696 to each electronic module 630, trading off against the flexibility of mounting locations for the electronic modules 330 To offset this tradeoff somewhat, additional communication lines 694 can be introduced as a means for connecting each unit rack 620 to the motherboard 690. In any case, the display unit 640 in one configuration can still be separately mounted with the mounting frame 600 along several ranges of mounting locations. Alternatively, the display 640 can be mounted to an instrument panel, as desired.

The communication lines 694 typically include electrical wires, however alternate means of communication such as fiber optic lines, or electromagnetic radiation could also be used. In one embodiment, the communication lines 694 attach to a connector 696 such as a pin connector. Because the display unit 640 is typically located in close proximity to the electronic modules 630, the communication lines 694 can be routed directly, increasing reliability. Because the display unit 640 can be separately mounted to the frame 600, or an instrument panel, the electronic modules 630 are also easily accessible for attachment of separate communication lines 694 (not shown). The installation procedure of the mounting system is therefore greatly simplified.

Thus, the invention can also be described as an electronic equipment module mounting system 688 which includes a mounting frame 600, a plurality of electronic equipment modules 630 (similar to or identical to modules 130, 230, and 330 described hereinabove), and a unit rack 620 coupled to each of the electronic modules 630, as well as to the mounting frame 600 along a module range of mounting locations 608 with respect to the mounting frame 600. As noted above, the exterior surface of each electronic module 630 is capable of slidable engagement with an interior surface of the corresponding unit rack 620. Cam levers included in the modules 630 can be used to remove and replace or install the modules 630 with respect to the unit racks 620. A display unit 640 can be mounted to an instrument panel, if desired, and located directly in front of the electronic equipment modules 630. The display unit 640 can then be placed in electronic communication with at least one of the electronic equipment modules 630, by way of connectors 692, 696, and communications lines 694. Any type of electronic circuitry can be included in the modules 630, including, for example, a GPS receiver.

Figure 7:
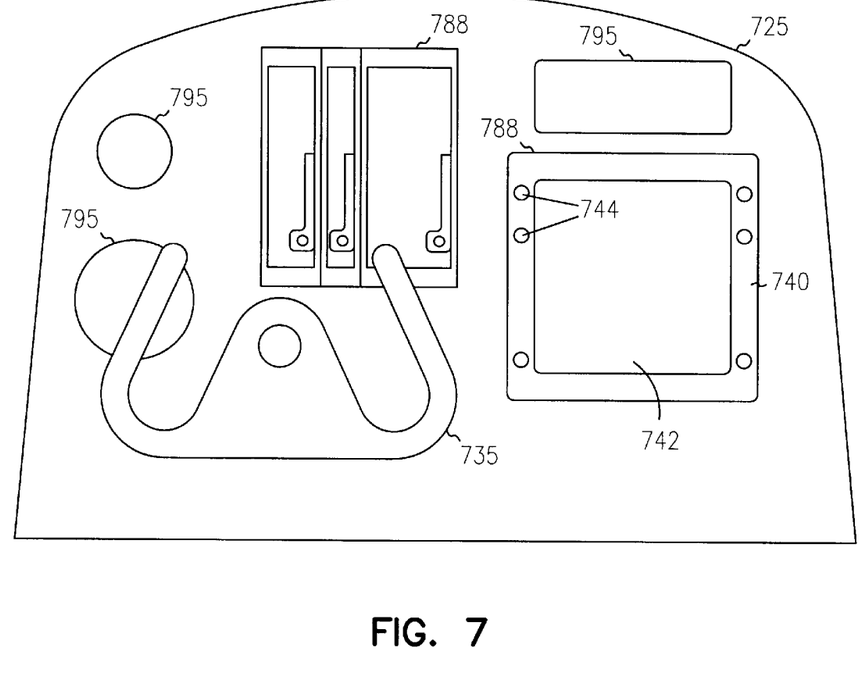
FIG. 7 is an avionic instrument panel and mounting system according to an embodiment of the invention.

FIG. 7 illustrates an avionic instrument panel as a possible mounting surface for use with the mounting system according to an embodiment of the present invention. The mounting surface, in the form of an instrument panel 725, includes a yoke 735, one or more mounting systems 788 according to the present invention, and various other instrumentation 795. The mounting systems 788 can include a display unit 740, if desired, attached to the instrument panel 725. As can be seen from the scale of various elements shown in FIG. 7, even small amounts of flexibility in mounting location along the ranges provided by the mounting systems 788 allow a significant number of displays 742 and controls 744 to fit on crowded areas of an instrument panel 725.

Returning to FIGS. 1A–1C, 3A–3C, and 5A–5B, a method of mounting an electronic equipment module in a mounting frame attached to a mounting surface can be described as follows. The procedure includes inserting the electronic module 130 into an open end 133 of a unit rack 120. Each of the modules 130 is similar to or identical to the modules 230, 330, 530, and 630 described previously. Therefore, the method also includes sliding an engagement lug 354 attached to a cam lever 352 into slidable engagement with a slot 368 located on the interior surface 562 of the unit rack 550, and electrically coupling one or more connectors 360 to one or more corresponding connectors 366 by rotating the cam lever 352 into an engaged position (see FIG. 3C) from a non-engaged position (see FIG. 3A). As this occurs, the engagement lug 354 slides from a first sub-slot 381 (included in the slot 368) into a second sub-slot 382 (also included in the slot 368) which intersects the first sub-slot 381. If an "over center" slot 368 design is used, the tension on the lever 352 will increase as the pivot 354 passes the intersection 383 and slides from the first sub-slot 381 into the second sub-slot 383. If a slot 368 having an acute angle a is used, the tension will then decrease.as the pivot comes to rest within the second sub-slot 383. Of course, as noted previously, the unit rack 120 can also be attached to the frame 100 before the electronic module 130 is inserted into the unit rack 120.

At this point, the connectors 360, 366 will be electrically coupled. If there is an offset distance 385 introduced between the pivot 353 and the engagement lug 354 locations, any force, vibration-induced or otherwise, which attempts to move the cam lever 352 from the engaged position to the non-engaged position will have to overcome the over-center resistance encountered as the engagement lug 354 is moved back from resting within the sub-slot 382 to the sub-slot 381, across the intersection 383. The method concludes with attaching the unit rack 120 to the mounting frame 100.

Referring specifically to FIG. 6, it can be seen that the method can also include establishing electrical communication between a display unit 640 and an electronic equipment module 630 (via communication lines 694 and connectors 692, 696), and mounting the display unit 640 on the mounting frame 600 along a range of mounting locations 608 with respect to the electronic equipment module 630. Of course, each unit rack 620 can also be positioned adjacent to the mounting frame 600 along a horizontal range of mounting locations 608. Establishing electrical communication between the display unit 640 and the electronic equipment module 630 typically includes coupling a motherboard 690 between the display unit 640 and the electronic equipment module 630.

Referring back to FIGS. 3A–3C, and assuming a cam lever 352 and fastener 370 are used to install the modules 330 into the unit racks 320, the method can include sliding the engagement lug 354 attached to the cam lever 352 into slidable engagement with the slot 368 located on the unit rack and electrically coupling the connectors 360, 366 by rotating the cam lever 352 into an engaged position from a non-engaged position. The method can also include rotating the fastener 370 attached to the cam lever 352 so as to secure the cam lever 352 in the engaged position, with or without the use of tools (e.g., when a quarter-turn locking fastener is used as the fastener 370).

Conclusion

An improved device, module, system, and method for mounting equipment modules, such as those used to enclose avionics, have been disclosed. The inventive concept of providing varying locations for key modular components allows a single mounting system to be used in conjunction with several varieties of aircraft, within the crowded confines of an instrument panel. The system enables module horizontal movement, and simultaneously, the ability to locate the display unit horizontally or vertically. The multi-dimensional mounting flexibility of the mounting system shown allows electronic modules to be mounted in close proximity to a display unit, which greatly increases accessibility of the modules over prior configurations where modules 130 were housed in the nose or rear of an aircraft. Installation, repair, and replacement are all greatly simplified with this configuration.

In addition, the present invention provides an apparatus, module, mounting system, and method for more efficient removal and installation of electronic equipment modules, especially those used as avionics equipment modules in aircraft. A tool-less installation mechanism is provided, in the form of a module retention device, such as a cam lever, assisted by a rotatable fastener. The system of the invention, along with the mechanism, allows aircraft technicians easy access to electronics located on an aircraft instrument panel, and rapid turnaround repair activity such that spare modules can be inserted and removed into their corresponding unit racks without using tools, if desired.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims. In the foregoing Detailed Description of Embodiments of the Invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description of Embodiments of the Invention, with each claim standing on its own as a separate preferred embodiment.

What is claimed is:

1. A module retention device, comprising:
   a cam lever extending along a first axis attached to a pivot extending along a second axis;
   an engagement lug attached to the cam lever; and
   a rotating fastener attached to the cam lever and capable of rotation about a third axis, wherein the first, second, and third axes are non-parallel, and wherein the pivot is attached to a chassis unit of the module and the engagement lug is adapted for slidable engagement with a slot included in a unit rack in sliding engagement with the module.

2. The retention device of claim 1, wherein the slot includes two open-ended sub-slots intersecting to form an acute angle between the sub-slots.

3. A module retention device, comprising:
   a cam lever extending along a first axis attached to a pivot extending along a second axis;
   an engagement lug attached to the cam lever; and
   a rotating fastener attached to the cam lever and capable of rotation about a third axis, wherein the first, second, and third axes are non-parallel, wherein the pivot and the engagement lug are not located coaxially, and wherein the pivot and the engagement lug are offset by a selected distance.

4. An electronic equipment module, comprising:
   a chassis unit having an exterior surface including a pivot and a rear face including a first electric connector mounted thereon, the exterior surface of the chassis unit capable of slidable engagement with an interior surface of a unit rack including a second electric connector mounted to the interior surface;
   a cam lever attached to the pivot, wherein the cam lever includes an engagement lug capable of slidable engagement with a slot located on the interior surface of the unit rack, wherein the first connector is capable of electrically coupling to the second connector when the cam lever is in an engaged position, and wherein the first connector is not electrically coupled with the second connector when the cam lever is in a non-engaged position; and
   a rotating fastener attached to the cam lever and capable of rotatable engagement with the chassis unit so as to secure the cam lever in the engaged position, wherein the rotating fastener is a quarter-turn locking fastener.

5. An electronic equipment module, comprising:
   a chassis unit having an exterior surface including a pivot and a rear face including a first electric connector mounted thereon, the exterior surface of the chassis unit capable of slidable engagement with an interior surface of a unit rack including a second electric connector mounted to the interior surface; and
   a cam lever attached to the pivot, wherein the cam lever includes an engagement lug capable of slidable engagement with a slot located on the interior surface of the unit rack, wherein the first connector is capable of electrically coupling to the second connector when the cam lever is in an engaged position, wherein the first connector is not electrically coupled with the second connector when the cam lever is in a non-engaged position, wherein the slot includes a first open-ended sub-slot located approximately parallel to a line extending from a front end of the unit rack to a rear end of the unit rack, and wherein the slot includes a second open-ended sub-slot which is not located approximately parallel to a line extending from the front end of the unit rack to the rear end of the unit rack.

6. An electronic equipment module, comprising:
   a chassis unit having an exterior surface including a pivot and a rear face including a first electric connector mounted thereon, the exterior surface of the chassis unit capable of slidable engagement with an interior surface of a unit rack including a second electric connector mounted to the interior surface; and a cam lever attached to the pivot, wherein the cam lever includes an engagement lug capable of slidable engagement with a slot located on the interior surface of the unit rack, wherein the first connector is capable of electrically coupling to the second connector when the cam lever is in an engaged position, wherein the first connector is not electrically coupled with the second connector when the cam lever is in a non-engaged position, and wherein the slot includes two open-ended sub-slots intersecting to form an acute angle.

7. An electronic equipment module mounting system, comprising:

a mounting frame adapted for mounting to a mounting surface;

a plurality of electronic equipment modules, wherein at least one of the electronic equipment modules includes a chassis unit having an exterior surface including a pivot and a rear face including a first electric connector mounted thereon; and a unit rack coupled to the at least one electronic equipment module and coupled to the mounting frame along a module range of mounting locations with respect to the mounting frame, wherein the exterior surface of the chassis unit is capable of slidable engagement with an interior surface of a the unit rack including a second electric connector mounted to the interior surface, wherein a cam lever is attached to the pivot, wherein the cam lever includes an engagement lug capable of slidable engagement with a slot located on the interior surface of the unit rack, and wherein the first connector is capable of electrically coupling to the second connector when the cam lever is in an engaged position, wherein the first connector is not electrically coupled with the second connector when the cam lever is in a non-engaged position, and wherein the mounting surface includes a cockpit instrument panel.

8. An electronic equipment module mounting system, comprising:

a mounting frame adapted for mounting to a mounting surface;

a plurality of electronic equipment modules, wherein at least one of the electronic equipment modules includes a chassis unit having an exterior surface including a pivot and a rear face including a first electric connector mounted thereon;

a unit rack coupled to the at least one electronic equipment module and coupled to the mounting frame along a module range of mounting locations with respect to the mounting frame, wherein the exterior surface of the chassis unit is capable of slidable engagement with an interior surface of a the unit rack including a second electric connector mounted to the interior surface, wherein a cam lever is attached to the pivot, and wherein the cam lever includes an engagement lug capable of slidable engagement with a slot located on the interior surface of the unit rack, wherein the first connector is capable of electrically coupling to the second connector when the cam lever is in an engaged position, and wherein the first connector is not electrically coupled with the second connector when the cam lever is in a non-engaged position; and a display unit located directly in front of the plurality of electronic equipment modules and in electronic communication with at least one of the plurality of electronic equipment modules, the display unit being mounted to an instrument panel.

9. An electronic equipment module mounting system, comprising:

a mounting frame adapted for mounting to a mounting surface;

a plurality of electronic equipment modules, wherein at least one of the electronic equipment modules includes a chassis unit having an exterior surface including a pivot and a rear face including a first electric connector mounted thereon; and a unit rack coupled to the at least one electronic equipment module and coupled to the mounting frame along a module range of mounting locations with respect to the mounting frame, wherein the exterior surface of the chassis unit is capable of slidable engagement with an interior surface of a the unit rack including a second electric connector mounted to the interior surface, wherein a cam lever is attached to the pivot, wherein the cam lever includes an engagement lug capable of slidable engagement with a slot located on the interior surface of the unit rack, wherein the first connector is capable of electrically coupling to the second connector when the cam lever is in an engaged position, wherein the first connector is not electrically coupled with the second connector when the cam lever is in a non-engaged position, and wherein at least one of the electronic equipment modules includes monitoring circuitry.

10. The mounting system of claim 9, wherein the monitoring circuitry includes engine monitoring circuitry.

11. The mounting system of claim 9, wherein the monitoring circuitry includes airframe monitoring circuitry.

* * * * *